United States Patent [19]

Tawara et al.

[11] Patent Number: 4,784,917
[45] Date of Patent: Nov. 15, 1988

[54] THERMOSETTING RESIN COMPOSITION AND LAMINATE AND PROCESS FOR THE PRODUCTION THEREOF

[75] Inventors: Keiko Tawara, Ibaraki; Akira Nagai, Hitachi; Akio Takahashi, Hitachiota; Katuo Sugawara, Hitachi; Masahiro Ono, Hitachi; Ritsuro Tada, Mito; Motoyo Wajima, Hadano; Toshikazu Narahara, Ibaraki, all of Japan

[73] Assignee: Hitachi, Ltd., Tokyo, Japan

[21] Appl. No.: 854,507

[22] Filed: Apr. 22, 1986

[30] Foreign Application Priority Data

Apr. 23, 1985 [JP] Japan .................................. 60-85497

[51] Int. Cl.$^4$ ...................... B32B 17/10; B32B 27/08; B32B 27/34
[52] U.S. Cl. .................................. 428/441; 428/476.1; 428/476.3; 525/232; 525/241
[58] Field of Search .................... 428/441, 476.1, 476.3

[56] References Cited

U.S. PATENT DOCUMENTS

| 4,020,225 | 4/1977 | Fujiwara et al. | 428/441 |
| 4,101,050 | 7/1978 | Buckler et al. | 428/441 |
| 4,239,807 | 12/1980 | Feldmann et al. | 428/476.3 |

FOREIGN PATENT DOCUMENTS 74869 1/1980 Japan .................................. 428/441

*Primary Examiner*—Jacob Ziegler
*Attorney, Agent, or Firm*—Antonelli, Terry & Wands

[57] ABSTRACT

A thermosetting resin composition comprising as essential constituents (a) a prepolymer comprising a poly(p-hydroxystyrene) derivative represented by the general formula

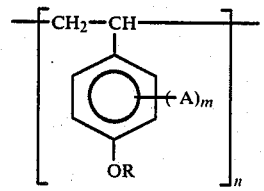

wherein A represents a hydrogen or halogen atom or an alkenyl or alkenoyl group having 2 to 4 carbon atoms, m represents a number in the range of from 1 to 4, and n represents a number in the range of from 1 to 100, and (b) a 1,2-polybutadiene or a derivative thereof. By using this novel resin composition and a customary equipment and procedure, it is easy to obtain a tack-free prepreg which is able to produce laminated materials of low permittivity suitable for use in multilayer printed circuit boards improved in peel strength of bonded copper foil, mechanical strengths, flame retardancy, and heat resistance, as compared to conventional printed circuit boards.

8 Claims, No Drawings

THERMOSETTING RESIN COMPOSITION AND LAMINATE AND PROCESS FOR THE PRODUCTION THEREOF

BACKGROUND OF THE INVENTION

1. Field of the Invention

This invention relates to a thermosetting resin composition, a laminated board employing said composition, and a process for the production thereof.

2. Description of the Prior Art

The laminated materials which have heretofore been used in multilayer printed circuit boards are chiefly laminated boards of phenolic, epoxy and polyimide resins. However, with the recent advance in high speed processing of large-scale computers, there is a demand for printed circuit boards of excellent electric characteristics for the purpose of improving the signal transmission rate. In particular, there is needed a printed circuit board of low permittivity in order to make shorter the signal transmission time-lag and also to decrease the thickness of a board. To meet the need for such low-permittivity laminated materials, there have been developed a laminated polytetrafluoroethylene (PTFE) resin board and a laminated butadiene resin board. The laminated PTFE resin board, however, presents problems such as a large thermal expansion coefficient at elevated temperatures and, unsatisfactory dimensional stability at elevated temperatures because the resin is thermoplastic and of a low glass transition point. Particularly when the laminated PTFE board is used for bonding of, multilayer its reliability of through hole is not sufficient. As a consequence, when it is applied to multilayer printed circuit board its wiring density is taken as in the same level as that of an epoxy resin-base printed circuit board, rendering the merit of low permittivity less significant. Further, since there is no suitable solvent for PTFE, bonding is generally made by applying heat and pressure, though the high melting point is one of the difficulties. In short, as compared with other conventional resins, PTFE presents difficulties in workability and moldability so that large changed must be made in the method of fabrication.

Contrary to the PTFE resin, butadiene resins are thermosetting. However, a butadiene resin which produces a varnish satisfactory for impregnation of the base material and subsequent curing exhibits a disadvantage of residual tackiness in the stage of prepreg, leading frequently to troubles in winding and laminating steps. Moreover, laminated polybutadiene boards are unsatisfactory in peel strength of the copper foil bonded to the board and in other properties such as mechanical strength, flammability, and heat resistance. Although the tackiness can be improved by the incorporation of a higher molecular-weight polymer, the improvement in peel strength of the bonded copper foil and other characteristics of the laminated board require still other means. For this purpose, there is proposed a method in which the polyubutadiene prepreg is overlaid with a coating layer comprising a different type of resin excellent in the properties in question [for example, Japanese Patent Application "Kokai" (Laid-open) No. 74,869/80]. Such a method, however, complicates the operation of lamination and the resulting laminate has a plurality of resin layers having different characteristics, so that properties of the butadiene resins appear not to be fully utilized.

SUMMARY OF THE INVENTION

The objects of the present invention are to provide (a) a low-permittivity laminated material excellent in mechanical strength, dimensional stability, heat resistance, and low flammability, which is adaptable to multilayer printed circuit boards, (b) a thermosetting resin composition having a low permittivity and a high adhesion to copper foil, which is suitable for making said laminated material, (c) a laminated board made by using said composition, and (d) a process for making said laminated board.

In the first place the present invention relates to a thermosetting resin composition characterized by comprising as essential constituents (a) a prepolymer comprising a poly(p-hydroxystyrene) derivative represented by the general formula

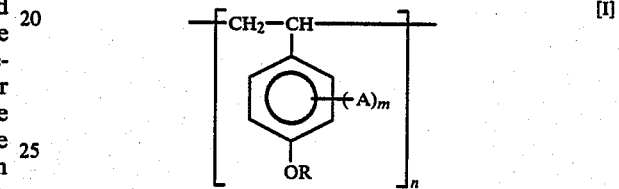

wherein A represents a hydrogen or halogen atom, R represents an alkenyl or alkenoyl group having 2 to 4 carbon atoms, m represents a number in the range of from 1 to 4, and n represents a number in the range of from 1 to 100, and (b) a 1,2-polybutadiene or a derivative thereof.

In the second place the present invention relates to a laminated board obtained from a prepreg impregnated with a synthetic resin, which is characterized in that said synthetic resin is the thermosetting resin composition of the first invention.

In the third place, the present invention relates to a process for producing the laminated board of the second invention, which comprises the steps in sequence of impregnating a base material in sheet form with a varnish containing the thermosetting resin composition of the above first invention and (c) a radical polymerization initiator; drying the impregnated base material to form a prepreg; and subjecting the prepreg to integral lamination molding under pressure.

The laminated board made by using the resin composition according to this invention is remarkably improved in insulation characteristics owing to the low permittivity of the resin used in said composition [for instance, when the composition is used in a multilayer board, the signal transmission time-lag is markedly diminished with a slight reduction in the relative permittivity, because the signal transmission time-lag (T) of a multilayer board is expressed by the formula $$T = \frac{l \cdot \sqrt{\epsilon r}}{c},$$

wherein c represents the light velocity, l represents the distance of signal transmission, and $\epsilon r$ repreeents the relative permittivity].

The prepolymer, which is one of the essential constituents of the present thermosetting resin composition, is represented by the general formula [I]. As examples of individual prepolymers conforming to the formula [I], mention may be made of ethers and esters of poly(p-hydroxystyrene) such as vinyl ether, isobutenyl ether, allyl ether, and acrylate ester, methacrylate ester, and bromide of the latter two. If desired, one or more of them are used.

1,2-polybutadienes in the compositions of the present invention which are the other essential constituent, include 1,2-polybutadiene homopolymer and various derivatives of polymers and copolymers containing as a fundamental ingredient 1,2-polybutadiene having vinyl side chains, such as cyclized 1,2-polybutadiene, terminally epoxidized 1,2-polybutdiene, 1,2-polybutadiene glycol, 1,2-polybutadienecarboxylic acid, urethane-modified 1,2-polybutadiene, 1,2-polybutadiene having terminal acryl groups, and terminally esterified 1,2-polybutadiene.

The weight ratio between said poly(p-hydroxystyrene) alkenyl ether, -acrylate, -methacrylate ester or derivatives thereof) and said 1,2-polybutadienes is selected from the range of from 90:10 to 10:90. If the former component content is larger than 90:10, the thermosetting resin will become higher in relative permittivity, whereas if it is below 10:90, functional effects of poly(p-hydroxystyrene) alkenyl ether, -acrylate, methacrylate or derivatives thereof on the characteristics of the laminated board such as flame retardancy, heat resistance, and adhesion to copper foil will become insignificant. The most preferred ratio is in the range of from 70:30 to 30:70.

A general procedure of making the laminated board according to this invention is described below.

A varnish is prepared by dissolving a poly(p-hydroxystyrene) derivative and a 1,2-polybutadiene or a derivative thereof in an organic solvent. The dissolution can be promoted by heating at a temperature of 80° C. or below for about 30 minutes.

Examples of the organic solvents are toluene, xylene, acetone, methyl ethyl ketone, 2-methoxyethanol, 3-methoxypropanol, N,N-dimethylformamide, N-methyl-2-pyrrolidone, dimethyl sulfoxide, trichloroethylene, and 1,1,2-trichloroethane. Any solvent capable of forming a uniform mixture of the constituent polymers can be used without restriction.

A radical polymerization initiator is added to the above resulting vanish to form an impregnation varnish. As typical examples of such initiators, there may be mentioned benzoyl peroxide, dicumyl peroxide, methyl ethyl ketone peroxide, tert-butyl perbenzoate, tert-butyl peroxylaurate, di-tert-butyl peroxyphthalate, and dibenzyl peroxide. The initiator is added in an amount of preferably 0.1 to 10 parts by weight for 100 parts by weight of the resin composition. A substrate material in sheet form is impregnated with the resulting impregnation varnish by dip coating. The impregnated material is dried at a temperature ranging from room temperature to 170° C. to produce a tack-free prepreg. The drying temperature varies depending upon the types of solvent and initiator which were used in the varnish. Finally a requisite number of the prepregs are superimposed on one another and cured by heating preferably at temperature of 100° to 250° C. under an applied pressure of 1 to 100 kgf/cm$^2$ to produce a laminated board.

As the substrate material in sheet form, use may be made of practically all of those commonly used in laminated materials. Suitable inorganic fibers include fibers of various glasses comprising as major constituent silica, alumina, or the like, such as E glass, C glass, A glass, S glass, D glass, YM-31-A glass, and Q glass made from quartz. Suitable organic fibers include aramide fiber comprising as a major ingredient a high-molecular compound having an aromatic polyamide-imide skeleton.

DETAILED DESCRIPTION OF THE PREFERRED EMBODIMENTS

The invention is illustrated in detail hereunder with reference to Examples, but the invention is not limited thereto.

EXAMPLE 1

Allyl ether of brominated poly(p-hydroxystyrene) (a product of Maruzen Oil Co., Ltd.) and 1,2-polybutadiene (molecular weight: $1.5 \times 10^5$; side chain vinyl group content: 90% or more) were dissolved in xylene by heating at 80° C. for 30 minutes to produce a varnish in which the ratio between the above polymers was 5:5 by weight and the solids content was 30 to 40%. To the varnish, was added 5 parts by weight of dicumyl peroxide as initator for 100 parts by weight of the varnish. A glass cloth (E glass of 0.1 mm in thickness, a product of Nitto Boseki Co., Ltd.) was impregnated with the resulting varnish by dip coating and dried for 20 minutes in air at a constant temperature of 100° to 120° C. to obtain a tack-free prepreg. A laminated board was obtained by superimposing ten sheets of the prepreg on one another and heating in a press under a pressure of 30 kgf/cm$^2$ at 130° C. for 30 minutes, then at 170° C. for 1 hour to effect simultaneously bonding and curing.

EXAMPLE 2

Brominated poly(p-hydroxystyrene) acrylate ester and the same 1,2-polybutadiene as that used in Example 1 were dissolved in N-methyl-2-pyrrolidone by heating at 80° C. for 30 minutes to produce a varnish in which the ratio between polymers was 5:5 by weight and the solids content was 30 to 40%. The varnish was treated in the same manner as in Example 1 to produce a laminated board.

EXAMPLE 3

Brominated poly(p-hydroxystyrene) methacrylate ester, the same 1,2-polybutadiene as that used in Example 1, and allyl isocyanurate (TAIC of Nippon Chemical Co., Ltd.) in a mixing ratio of 3:5:2 by weight were dissolved in xylene by heating at 80° C. for 30 minutes to produce a varnish having a solids content of 40%. The varnish was treated in the same manner as in Example 1 to obtain a laminated board.

Comparative Example 1

A laminated board was obtained in a manner similar to that in Example 1 by using 1,2-polybutadiene alone.

Comparative Example 2

Brominated poly(p-hydroxystyrene) (a product of Maruzen Oil Co., Ltd.) and a bisphenol A-based epoxy resin ("Epikote 828" manufactured by Shell Chemical Co., Ltd.; 188 epoxy equivalents) in a mixing ratio of 7:3 by weight were dissolved in methyl ethyl ketone by heating at 60° C. for 30 minutes to produce a varnish having a solids content of 40%. After addition of 0.5 part by weight of 2-ethyl-4-methylimidazole as crosslinking promotor to 100 parts by weight of the varnish, the resulting varnish was treated as in Example 1 to obtain a laminated board.

The principal characteristics of the laminated boards obtained in the above Examples and Comparative Examples and the heat resistances of thermosetting resins were as shown in Table 1.

TABLE 1

| Characteristics | Unit | Example | | | Comparative Example | |
|---|---|---|---|---|---|---|
| | | 1 | 2 | 3 | 1 | 2 |
| Permittivity (1 MHz) | | 3.4 | 3.6 | 3.6 | 3.0 | 4.8 |
| Peel strength of copper foil | kgf/cm | 1.0 | 1.2 | 1.4 | 0.8 | 1.4 |
| Flame retardancy (UL 94, V-O) | | o | o | o | x | o |

As is apparent from Table 1, the laminated boards of this invention were lower in permittivity compared with that obtained in Comparative Example 2 and were higher in flame retardancy compared with that obtained in Comparative Example 1.

What is claimed is:

1. A laminated board obtained from a prepreg impregnated with a synthetic resin which is a thermosetting resin composition consisting essentially of (a) a prepolymer consisting of a poly(p-hydroxystyrene) derivative represented by the general formula:

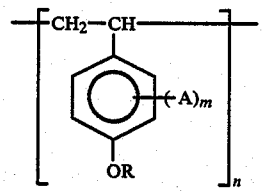

[I]

wherein A represents a hydrogen or halogen atom, R represents an alkenyl or alkenoyl group having 2 to 4 carbon atoms, m represents a number in the range of from 1 to 4, and n represents a number in the range of from 1 to 100, (b) a 1,2-polybutadiene or a derivative thereof and (c) a radical polymerization initiator.

2. A laminated board according to claim 1, wherein said thermosetting resin composition is cured to provide a reaction product of (a) and (b) in the presence of (c).

3. A laminated board according to claim 2, wherein the weight ratio between the (a) prepolymer and the (b) 1,2-polybutadiene or derivative thereof is in the range of from 90:10 to 10:90.

4. A laminated board according to claim 3, wherein said thermosetting resin composition is impregnated as a varnish prepared by dissolving the (a) prepolymer and the (b) 1,2-polybutadiene or derivative thereof in an organic solvent.

5. A laminated board obtained from a prepreg impregnated with a synthetic resin which is a thermosetting resin composition consisting essentially of (a) a prepolymer consisting of a poly(p-hydroxystyrene) derivative represented by the general formula:

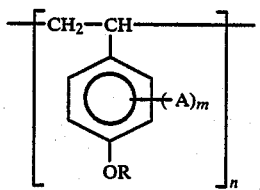

[I]

wherein A represents a halogen atom, R represents an alkenyol group having 2 to 4 carbon atoms, m represents a number in the range of from 1 to 4, and n represents a number in the range of from 1 to 100, (b) a 1,2-polybutadiene and (c) a radical polymerization initiator.

6. A laminated board according to claim 5, wherein said thermosetting resin composition is cured to provide a reaction product of (a) and (b) in the presence of (c).

7. A laminated board according to claim 6, wherein the weight ratio between the (a) prepolymer and the (b) 1,2-polybutadiene thereof is in the range of from 90:10 to 10:90.

8. A laminated board according to claim 7, wherein said thermosetting resin composition is impregnated as a varnish prepared by dissolving the (a) prepolymer and the (b) 1,2-polybutadiene thereof in an organic solvent.

* * * * *